(12) United States Patent
Blanchard et al.

(10) Patent No.: US 10,432,140 B2
(45) Date of Patent: Oct. 1, 2019

(54) METHOD FOR TESTING A CONCENTRATED PHOTOVOLTAIC MODULE

(71) Applicant: Saint-Augustin Canada Electric Inc., Saint-Augustin de Desmaures (CA)

(72) Inventors: Remi Blanchard, Grenoble (FR); Philippe Gastaldo, Pontcharra (FR)

(73) Assignee: Saint-Augustin Canada Electric Inc., Saint-Augustin de Desmaures, Quebec (CA)

( * ) Notice: Subject to any disclaimer, the term of this patent is extended or adjusted under 35 U.S.C. 154(b) by 339 days.

(21) Appl. No.: 15/036,030

(22) PCT Filed: Nov. 14, 2014

(86) PCT No.: PCT/EP2014/074632
§ 371 (c)(1),
(2) Date: Aug. 4, 2016

(87) PCT Pub. No.: WO2015/071423
PCT Pub. Date: May 21, 2015

(65) Prior Publication Data
US 2016/0344340 A1 Nov. 24, 2016

(30) Foreign Application Priority Data
Nov. 14, 2013 (FR) ..................... 13 61139

(51) Int. Cl.
*H02S 50/15* (2014.01)
*H01L 31/0687* (2012.01)
(Continued)

(52) U.S. Cl.
CPC ............ *H02S 50/15* (2014.12); *H01L 31/054* (2014.12); *H01L 31/0547* (2014.12);
(Continued)

(58) Field of Classification Search
CPC ....... H02S 50/00; H02S 50/15; H01L 31/054; H01L 31/0687; H01L 31/0547; Y02E 10/52
See application file for complete search history.

(56) References Cited

U.S. PATENT DOCUMENTS 3,877,814 A * 4/1975 Hess ..................... G01N 21/896
356/430
2009/0194098 A1 * 8/2009 Placer ..................... F24J 2/464
126/704
(Continued)

FOREIGN PATENT DOCUMENTS

CN 101351715 A 1/2009
CN 102160189 B 3/2014
(Continued)

OTHER PUBLICATIONS

English translation of JP 2010186890 A.*
(Continued)

*Primary Examiner* — Patrick Assouad
*Assistant Examiner* — Haidong Zhang
(74) *Attorney, Agent, or Firm* — TraskBritt

(57) ABSTRACT

The invention relates to a method for testing a concentrated photovoltaic module comprising a plurality of sub-modules, each containing a plurality of assemblies of a photovoltaic cell and of a concentrator arranged relative to the cell in order to concentrate on the cell radiation arriving at normal incidence, in which: a plurality of almost collimated light beams are transmitted toward the module by means of a plurality of light sources coupled to respective parabolic mirrors, each light source comprising a lamp suitable for emitting a light pulse and a supply device suitable for electrically supplying the lamp, there being a turn-on delay between the triggering of the supply device and the emission of the pulse, and the supply device of each lamp is triggered (Continued)

at a respective instant set depending on the turn-on delay of the lamp so that the pulses of all the lamps are emitted simultaneously and received simultaneously by the sub-modules.

13 Claims, 3 Drawing Sheets

(51) Int. Cl.
 *H01L 31/054* (2014.01)
 *H02S 50/00* (2014.01)
(52) U.S. Cl.
 CPC .......... *H01L 31/0687* (2013.01); *H02S 50/00* (2013.01); *Y02E 10/52* (2013.01)

(56) References Cited

U.S. PATENT DOCUMENTS

| | | |
|---|---|---|
| 2010/0006139 A1 | 1/2010 | Zahuranec et al. |
| 2011/0017269 A1 | 1/2011 | Fangman et al. |
| 2011/0246109 A1 | 10/2011 | Fafard |
| 2011/0273020 A1* | 11/2011 | Balachandreswaran ............ H01L 31/02021 307/71 |
| 2012/0097546 A1 | 4/2012 | Kabagambe et al. |
| 2012/0223733 A1 | 9/2012 | Gunawan et al. |

FOREIGN PATENT DOCUMENTS

| | | | |
|---|---|---|---|
| CN | 102721841 B | 10/2014 | |
| JP | 2010186890 A * | 8/2010 | .............. F21S 8/006 |
| WO | 2010003115 A1 | 1/2010 | |

OTHER PUBLICATIONS

International Search Report for International Application No. PCT/EP2014/074632 dated Jan. 14, 2015, 2 pages.
International Written Opinion for International Application No. PCT/EP2014/014632 dated Jan. 14, 2015, 5 pages.
Chinese First Search for Chinese Application No. 201480072325, dated Jul. 18, 2018, 2 pages.
Chinese First Office Action for Chinese Application No. 201480072325, dated Jul. 27, 2018, 9 pages.

* cited by examiner

METHOD FOR TESTING A CONCENTRATED PHOTOVOLTAIC MODULE

CROSS-REFERENCE TO RELATED APPLICATIONS

This application is a national phase entry under 35 U.S.C. § 371 of International Patent Application PCT/EP2014/074632, filed Nov. 14, 2014, designating the United States of America and published as International Patent Publication WO 2015/071423 A1 on May 21, 2015, which claims the benefit under Article 8 of the Patent Cooperation Treaty to French Patent Application Serial No. 1361139, filed Nov. 14, 2013. The subject matter of this application is also related to the subject matter of U.S. patent application Ser. No. 15/036,036, which was filed May 11, 2016 and titled "Device for Testing a Concentrated Photovoltaic Module."

TECHNICAL FIELD

This disclosure relates to a method and a device for testing a concentrated photovoltaic module.

BACKGROUND

A concentration photovoltaic module (CPV) essentially comprises a photovoltaic cell (for example, multi-junction) and a concentrator designed to concentrate solar radiation toward the cell.

In the case of a multi junction cell, the different junctions are arranged in series, each of the junctions being adapted to a specific spectral band of the solar spectrum.

Multi junction cells, which are a smaller size than conventional solar cells made of silicon, have the advantage of offering better efficiency, but to function, need a higher light intensity.

In a CPV module, the cells are associated with a concentrator, for example, a Fresnel lens, which concentrates solar radiation toward the cell.

Also, photovoltaic modules are designed to be mounted on a sun-follower system (also called "tracker") so as to optimally orient the module as a function of the trajectory of the sun so that the concentrators focus the rays of the sun onto the cells.

During manufacture of such photovoltaic modules, it is usual to verify the operation and performance of each module, with a view to detecting any failure of any one of the junctions, defects in quality or positioning of concentrators, or any other anomaly of the module before it is shipped.

The modules are frequently combined by being mounted totally or partially in series. In this case, performance of the overall system will be limited by the weakest element. It can, therefore, prove useful to select the modules before they are combined so that they are homogeneous in response. In this respect, it is important to be able to measure the performance of this module.

For this purpose, it is known to simulate the lighting of the sun by means of a lighting device generally called "flasher," which generates a light beam having irradiance, spectral power distribution and angular divergence close to those of the sun. These characteristics are to conform over the entire surface of the module to be tested.

CPV modules currently commercially available have relatively small dimensions (of the order of 0.5 to 1.5 m$^2$). There are lighting devices that simulate solar lighting on a module of this type.

The Soitec company has marketed large-size solar modules, having a surface of several m$^2$, comprising several CPV modules connected by a single chassis.

So, for example, a module of 8 m$^2$ can be formed by two rows of six sub-modules, which can optionally be connected in series.

There is, therefore, the problem of being able to test a large-size module. In fact, since the sub-modules are connected totally or partially in series and their mechanical integrity is assured by a single chassis, they cannot be tested independently.

On the other hand, it is important to ensure the operation of the assembly before it is installed.

It is, therefore, necessary to be able to verify the performance of the complete module by simulating lighting that is closest to solar radiation.

In this respect, the constraints the lighting device must respect are the following:

- irradiance comparable to that produced by the sun at ground level, that is, of the order of 1 kW/m$^2$,
- reproduction of the complete solar spectrum, from ultraviolet to infrared, by respecting spectral densities,
- angular divergence close to that of solar light, that is, 0.5° (±0.25°), and
- considerable spatial uniformity of the irradiance (the aim being inhomogeneity of irradiance less than or equal to 5%).

Known lighting devices do not respond to these demands for a large-size module.

In fact, these devices offer either a more reduced field or characteristics (especially angular divergence) too far removed from those of the sun.

Such characteristics on extended fields of the order of a square meter to a few square meters with a single light source are possible to reproduce only over very short periods with flash lamps.

In fact, the power necessary to produce irradiance of the order of 1 kW/m$^2$ on a surface of the order of the m$^2$ would be too great to be continued (power consumption would then be very high with consequent heating of the system).

Flash lamps are generally used in this type of lighting device as they reach sufficient intensity to test the photovoltaic modules.

Another constraint to be considered in designing the lighting device is the compactness of the test installation.

So, it is not feasible to place a light source far from the module to obtain low angular divergence because, given the surface of the module, this would imply a distance of several tens of meters not compatible with an industrial installation.

It might be feasible to use several known devices that would illuminate each part of the module.

However, the problem of synchronization of light sources comprising flash lamps producing different beams arises.

In fact, light sources produce light pulses and the measurement of performance of the module is recorded during these pulses.

So that measurement can be carried out, pulses, therefore, have to be produced at the same instant for all of the light sources, that is, the sources are synchronized in a range of the order of a few hundreds of μs.

Flash lamps of light sources are supplied by condenser batteries.

There is, therefore, a delay between triggering of the source and emission of the pulse, which is greater than the preferred range of synchronization.

This delay is variable from one source to the other.

It can be due to the impedance of the electric triggering circuit, or to delays due to the differences of clocks of triggering cards.

BRIEF SUMMARY

An aim of the disclosure is to design a device for testing a large-size concentrated photovoltaic module that respects the constraints mentioned hereinabove, and that offers especially precise synchronization of the light sources. According to the disclosure, a method for testing a concentrated photovoltaic module is proposed comprising a plurality of sub-modules, each comprising a plurality of assemblies of a photovoltaic cell and a concentrator arranged relative to the cell to concentrate toward the cell radiation arriving in normal incidence, the method being characterized in that:
- a plurality of almost collimated light beams is sent toward the module by means of a plurality of light sources coupled to respective parabolic mirrors, each light source comprising a lamp adapted to emit a light pulse and a supply device adapted to electrically supply the lamp, each light source having a turn-on delay between triggering of the supply device and emission of the pulse by the lamp, the delay being particular to each respective light source,
- the supply device of each lamp is triggered at a respective instant determined as a function of the turn-on delay of the lamp, such that the pulses of all of the lamps are simultaneously emitted and simultaneously received by the modules, and
- the response of the module is measured during the simultaneous pulses.

By simultaneity of pulses, it is clear that the pulses present light intensity covering (their characteristic of light emission) of at least 95%, preferably at least 98.5%.

For example, for a measurement period of 1 ms, it is ensured that the maximal distance between the respective instants of pulses of two lamps is less than or equal to 50 preferably less than or equal to 15 μs.

"Almost collimated beam" in the present text means a beam whereof the divergence is low, typically less than 1°. In this disclosure, to reproduce the divergence of the sun, the almost collimated beam may have a divergence of +/−0.25°.

As is known per se, each almost collimated beam is obtained by placing the orifice of each light source at the focal point or in the vicinity of the focal point of the parabolic mirror to which it is coupled, the skilled person being capable of defining the dimensional characteristics of the orifice and of the source-mirror couple to obtain such an almost collimated beam.

By way of advantage, the turn-on delay of each lamp is previously determined by measuring the triggering instant of the supply device and the instant of the pulse, the turn-on delay being determined as being equal to the difference between the instant of the pulse and the triggering instant.

According to an embodiment, the measurements are made by replacing each sub-photovoltaic module by a test component comprising a mono junction photovoltaic cell.

Preferably, the lamps are flash lamps.

According to an embodiment, as many parabolic mirrors as light sources are used, each light source being arranged at the focal point of the corresponding parabolic mirror.

According to a particular embodiment, as many specific light sources and parabolic mirrors as sub-modules of the photovoltaic module to be tested are used, each light source and each parabolic mirror being coupled so as to send an almost collimated light beam toward a corresponding sub-module.

The surface of the module to be tested can be greater than or equal to 8 m².

Also, the cells of the module can be multi-junction cells.

Another aim of the disclosure is a device for testing a concentrated photovoltaic module comprising a plurality of sub-modules, each comprising a plurality of assemblies of a photovoltaic cell and a concentrator arranged relative to the cell to concentrate toward the cell radiation arriving in normal incidence, the test device being characterized in that it comprises:
- a plurality of light sources, each light source comprising a lamp adapted to emit a light pulse and a supply device adapted to electrically supply the lamp, each light source having a turn-on delay between triggering of the supply device and emission of the pulse by the lamp, the delay being particular to each respective light source,
- a plurality of parabolic mirrors coupled to the light sources so as to send back light originating from each source in a plurality of almost collimated light beams toward the module to be tested, in a direction perpendicular to the surface of the module,
- a synchronization system of the light sources configured to trigger the supply device of each lamp at a respective instant determined as a function of the turn-on delay of the lamp, such that the pulses of the lamps are simultaneously emitted and simultaneously received by the sub-modules, and
- a measuring device for measuring the response of the module during the simultaneous pulses.

BRIEF DESCRIPTION OF THE DRAWINGS

Other characteristics and advantages of the disclosure will emerge from the following detailed description in reference to the appended drawings, in which.

DETAILED DESCRIPTION

Figure 1A:
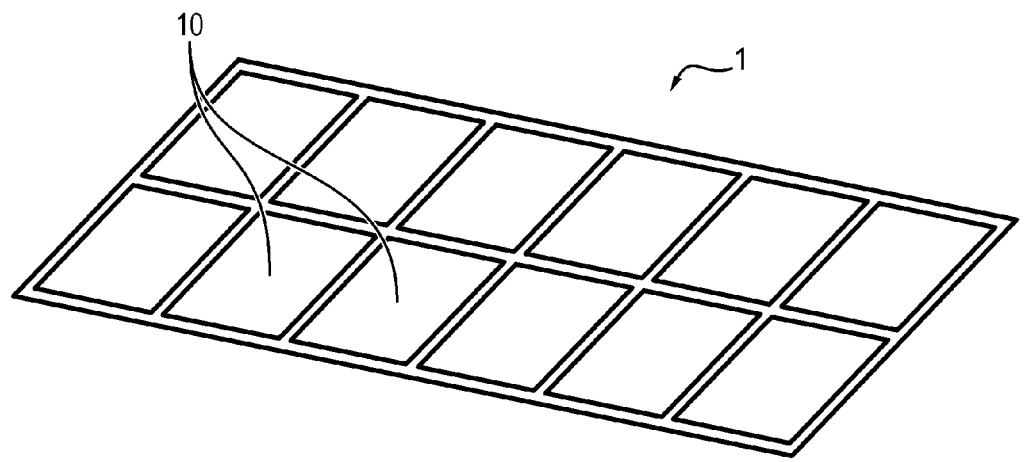
FIG. 1A is a schematic diagram of a concentrated photovoltaic module comprising several sub-modules connected in series.

FIG. 1A is a schematic diagram of a photovoltaic module that may be tested using embodiments of the present disclosure.

Module 1 to be tested comprises a plurality of concentrated sub-photovoltaic modules 10.

Each sub-module 10 comprises a plurality of cell-concentrator assemblies.

Figure 1B:
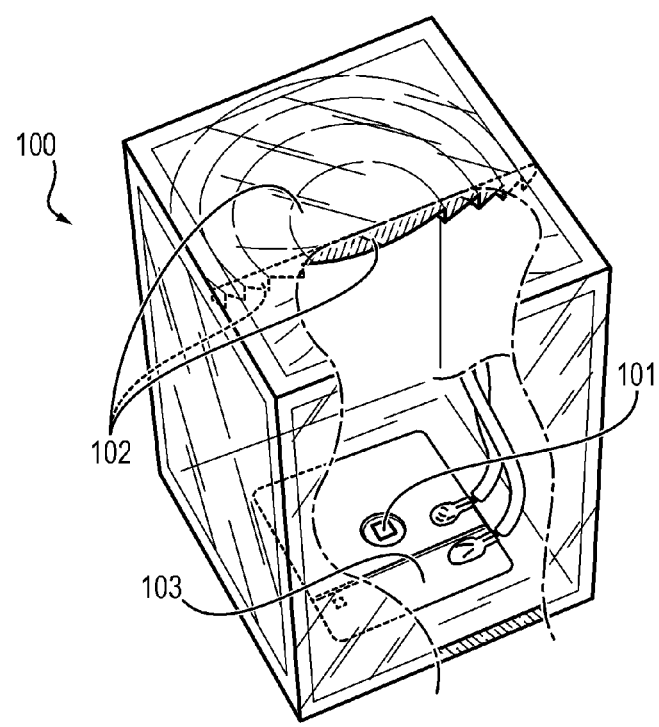
FIG. 1B is a schematic diagram of a photovoltaic cell-concentrator assembly belonging to a sub-module of such a module.

As illustrated in FIG. 1B, each assembly 100 essentially comprises a photovoltaic cell 101 (for example, multi-junction) and a concentrator 102 designed to concentrate the solar radiation arriving in normal incidence toward the cell 101. Optionally, the cell 101 is placed on a heat dissipater 103 to limit its rise in temperature.

The concentrator 102 comprises, for example, a Fresnel lens.

In the present text, the surface of the module to be tested is the surface of the concentrators.

The sub-modules 10 forming the module 1 can optionally be electrically connected in series or in parallel.

The surface of each sub-module 10 generally has a rectangular shape, whereof the width and height are, respectively, in the following ranges: between 30 and 80 cm in width, for example, 60 cm, and between 60 and 150 cm in height, for example, 120 cm.

The sub-modules 10 are typically arranged in the form of rows and/or columns to form the module.

For example, a module of 8 m$^2$ can be formed from two rows of six sub-modules, each sub-module having a surface of around 0.7 m$^2$.

Figure 2:
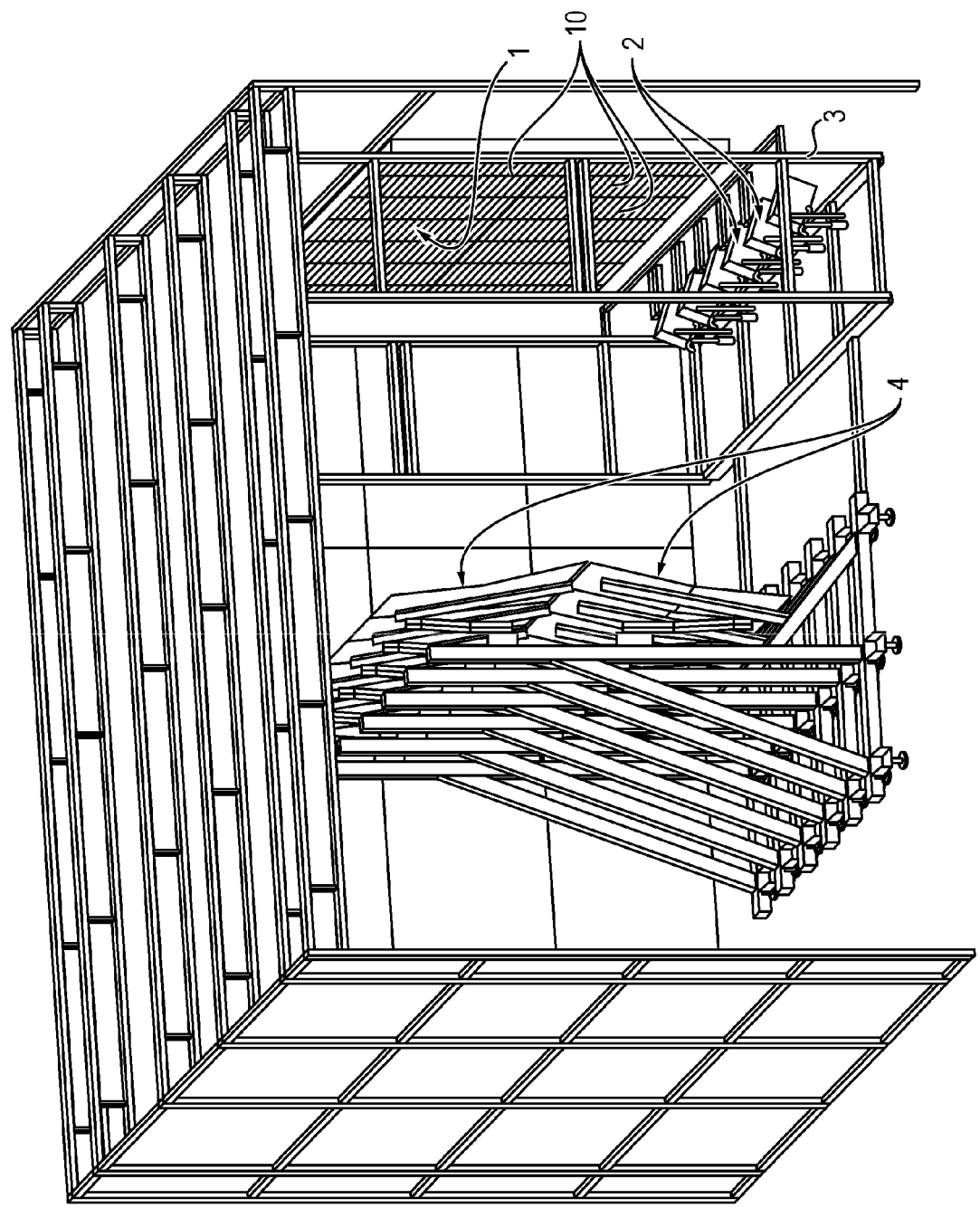
FIG. 2 is an assembly view of a test device according to the disclosure.

FIG. 2 is an assembly view of a test device according to the disclosure.

The device comprises a support 3 for the module 1 to be tested.

Preferably, the support 3 is arranged such that the surface of the module to be tested is vertical.

"Vertical" in the present text means a direction perpendicular to the floor of the building in which the test device is installed.

The module is coupled to a measuring device (not illustrated) that measures the response of the module to the lighting by a light beam.

Measurement is performed during a determined period, for example, of the order of 1 ms.

In front of the support 3, the test device comprises a plurality of light sources 2 and a plurality of parabolic mirrors 4 coupled to the light sources so as to reflect the light originating from each source in an almost collimated light beam in a direction perpendicular to the surface of the module.

According to a preferred embodiment, each source is arranged at the focal point of the corresponding parabolic mirror.

In this case, the test device, therefore, comprises as many sources as mirrors.

This utilizes a plurality of identical mirrors, whereof the position and orientation are adjusted so as to send back toward the module to be tested an almost collimated beam perpendicular to the surface of the module.

According to another embodiment, each light source can be coupled to several mirrors, to the extent where these mirrors are arranged such that their focal points are combined, the source being arranged at the placement of these focal points.

In the embodiment illustrated in FIG. 2, where the module 1 comprises two horizontal rows of six sub-modules 10, the test device comprises twelve light sources 2 placed according to two horizontal rows on either side of the module 1, and twelve parabolic mirrors 4 placed according to two horizontal rows facing the module 1.

Each source and the corresponding parabolic mirror are oriented relative to each other such that the light beam sent back by the mirror is perpendicular to the surface of the corresponding sub-module.

The distance between the sources and the parabolic mirrors is defined such that the almost collimated light beam sent back by each mirror illuminates with the preferred characteristics the entire surface of the corresponding sub-module.

This distance, as well as the surface of the mirrors, therefore, depends on the surface of the sub-modules of the module to be tested.

Without wanting to be limiting, it is considered that a distance of the order of 2 to 6 meters measured at the ground between the parabolic mirrors and the light sources—which determines the majority of the surface at the ground of the test device—is reasonable.

But it is not indispensable for the number of light sources and parabolic mirrors to be identical to the number of sub-modules of the photovoltaic module to be tested.

In fact, if the surface of each sub-module is sufficiently low, it can eventuate that a light source—parabolic mirror couple illuminates several sub-modules and retains a ground space acceptable to the test device and a mirror size that does not impair its manufacturing cost.

On the other hand, there can be areas at the border between adjacent almost collimated beams in which the intensity fails to satisfy the criteria for uniformity or divergence.

In this case, the light sources and the parabolic mirrors are advantageously arranged so that areas not illuminated by the collimated beams sent by the mirrors coincide with the areas separating the sub-modules from the module to be tested, which are not functional in terms of photovoltaic conversion.

For reasons of assemblage of the modules, as is evident from FIG. 1A, there is, in fact, a space between two adjacent sub-modules 10, at which no photovoltaic conversion takes place.

In this way, if any defects in uniformity occur in these areas, these defects have no negative effect on the quality of the test.

To allow this adjustment, the test device is designed such that adjustment of the position and orientation of each mirror is possible.

Clearance is advantageously provided between the mirrors to enable such adjustments.

Each light source comprises a lamp selected for its capacity to produce the preferred light spectrum and irradiance, and a supply device adapted to electrically supply the lamp.

In general, the lamp is a flash lamp.

For example, the lamp is a xenon flash lamp.

Figure 3:
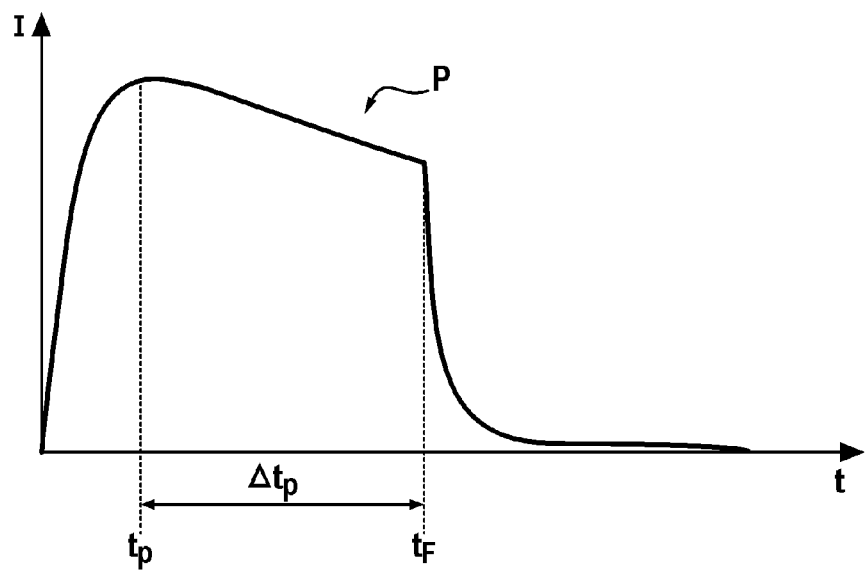
FIG. 3 illustrates a light pulse.

Such an adapted lamp emits lighting in the form of a light pulse P, as illustrated in FIG. 3.

Such a pulse is obtained by a sudden discharge of a battery of condensers.

The pulse P, therefore, has a maximum intensity at an instant $t_P$ considered in the present text as being the instant of the pulse, followed by slow decrease of the intensity to an instant $t_F$ where the discharge is interrupted by short-circuiting it via low resistance so as to limit the power sent to the lamp.

In fact, because the lamp can support low power only, the period of the pulse must be all the shorter since an intense pulse is wanted.

To conserve a relatively flat form of the pulse around the maximum intensity (the pulse being similar to a slot), an oversized battery of condensers is advantageously used and the discharge is interrupted once measurement is made.

Measurements made on the module must be made during the pulse of each lamp, after the instant $t_P$.

The period $\Delta t_P$ of the pulse, corresponding to the difference between the instants $t_F$ and $t_P$, is, therefore, defined so as to be at least equal to the sum of the period necessary for measurement, of maximal time offset, which can exist between the pulses of two lamps, and a safety margin, if needed.

In practice, the period of the pulse is typically between 500 μs and 2 ms.

According to an embodiment of the disclosure, the measurement is taken during a period of 1 ms, the period of the pulse of each lamp being slightly greater than this period.

Naturally, it is possible to take the measurement during a shorter period, for example, if a lamp producing a higher intensity is used, the pulse then having to be shorter.

The supply device of lamps is conventional and, therefore, needs no further description, the skilled person able to choose any adequate supply device present on the market.

Due to the electronic components used in the supply device and the use of a plurality of triggering cards each comprising a different clock, a turn-on delay usually occurs between triggering of the supply device and emission of the pulse by the lamp.

To eliminate the existence of this delay, which is variable from one source to the other, the disclosure proposes a synchronization method of pulses of different lamps described hereinbelow.

In a first instance, the turn-on delay for each light source is determined.

Determination of this delay can be performed by measuring both the triggering instant of the lamp and also the instant when the maximum intensity of the pulse occurs.

The measurement of the instant of the pulse can be obtained by placing, in place of a sub-module, a test component comprising a mono-junction cell, for example.

Such a component does produce an instantaneous response (or in any case, with a negligible delay of response relative that to be measured) to a lighting pulse, such that it is possible to directly measure the instant of the pulse.

The turn-on delay is defined as being the difference between the instant of the pulse and the triggering instant.

The turn-on delay for each lamp is measured by proceeding as indicated hereinabove.

Once this measurement is taken, the turn-on delay is unlikely to vary since each lamp is functional.

It is sufficient to measure the turn-on delay when a lamp on the test device is replaced.

The test device comprises a synchronization system of the light sources, which comprises a memory in which the turn-on delay of each source is recorded.

The synchronization system further comprises a processor that, when a triggering order of sources is emitted, determines, for each source, the triggering instant of each lamp as being equal to the difference between a determined instant at which the synchronized pulse must occur and the turn-on delay of each source.

The synchronization system then triggers each source at this respective determined instant.

So, the pulses of all of the lamps are simultaneous.

Figure 4:
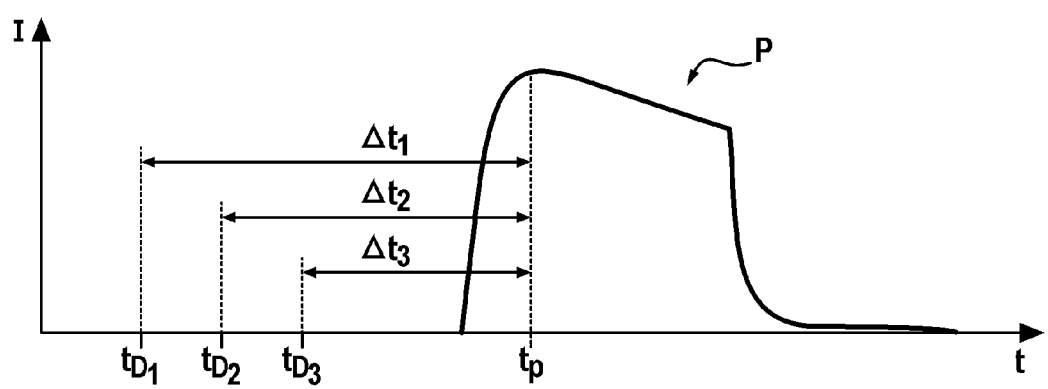
FIG. 4 illustrates the synchronization principle for three light sources.

This principle is shown in FIG. 4, in the case of three light sources.

FIG. 4 shows the light intensity I of the pulse as a function of time t.

The instant of the pulse P, which is here synchronized for the three sources, is noted $t_P$.

The first light source has a turn-on delay $\Delta t_1$ and is triggered at an instant $t_{D1}=t_P-\Delta t_1$.

The second light source has a turn-on delay $\Delta t_2$ and is triggered at an instant $t_{D2}=t_P-\Delta t_2$.

The third light source has a turn-on delay $\Delta t_3$ and is triggered at an instant $t_{D3}=t_P-\Delta t_3$.

In this way, each sub-module receives the pulse of each source at the same instant.

The invention claimed is:

1. A method for testing a concentrated photovoltaic module comprising a plurality of sub-modules, each comprising a plurality of assemblies of a photovoltaic cell and a concentrator arranged relative to the cell to concentrate toward the cell radiation arriving in normal incidence, wherein:
   a plurality of almost collimated light beams is obtained by reflecting light originating from each light source of a plurality of light sources by a parabolic mirror, a plurality of light sources being coupled to respective parabolic mirrors and each light source and the corresponding parabolic mirror being oriented relative to each other,
   the plurality of almost collimated light beams is sent toward the module by means of the plurality of light sources coupled to the respective parabolic mirrors, each light source comprising a lamp adapted to emit a light pulse and a supply device adapted to electrically supply the lamp, each light source having a turn-on delay between triggering of the supply device and emission of the pulse by the lamp, the delay being particular to each respective light source,
   the supply device of each lamp is triggered at a respective instant determined as a function of the turn-on delay of the lamp such that the pulses of all of the lamps are simultaneously emitted and simultaneously received by the sub-modules, and
   the response of the module is measured during the simultaneous pulses,
   wherein the turn-on delay of each lamp is previously determined by measuring the triggering instant of the supply device and the instant of the pulse, the turn-on delay being determined as being equal to the difference between the instant of the pulse and the triggering instant.

2. The method according to claim 1, wherein the measurements of the turn-on delay are made by replacing each sub-photovoltaic module by a test component comprising a mono-junction photovoltaic cell.

3. The method according to claim 2, wherein the lamps are flash lamps.

4. The method according to claim 3, wherein as many parabolic mirrors as light sources are used, each light source being arranged at the focal point of the corresponding parabolic mirror.

5. The method according to claim 4, wherein as many specific light sources and parabolic mirrors as sub-modules of the photovoltaic module to be tested are used, and each light source and each parabolic mirror are coupled so as to send an almost collimated light beam toward a corresponding sub-module.

6. The method according to claim 5, wherein the surface of the module to be tested is greater than or equal to 8 m².

7. The method according to claim 6, wherein the cells of the module are multi junction cells.

8. The method according to claim 1, wherein the lamps are flash lamps.

9. The method according to claim 1, wherein as many parabolic mirrors as light sources are used, each light source being arranged at the focal point of the corresponding parabolic mirror.

10. The method according to claim 9, wherein as many specific light sources and parabolic mirrors as sub-modules of the photovoltaic module to be tested are used, and each light source and each parabolic mirror are coupled so as to send an almost collimated light beam toward a corresponding sub-module.

11. The method according to claim 1, wherein the surface of the module to be tested is greater than or equal to 8 m$^2$.

12. The method according to claim 1, wherein the cells of the module are multi junction cells.

13. A device for testing a concentrated photovoltaic module comprising a plurality of sub-modules, each comprising a plurality of assemblies of a photovoltaic cell and a concentrator arranged relative to the cell to concentrate toward the cell radiation arriving in normal incidence, the test device comprising:

a plurality of light sources, each light source comprising a lamp adapted to emit a light pulse and a supply device adapted to electrically supply the lamp, each light source having a turn-on delay between triggering of the supply device and emission of the pulse by the lamp, the turn-on delay being particular to each respective light source, a plurality of parabolic mirrors coupled to the light sources, each source and the corresponding parabolic mirror being oriented relative to each other, so as to send back light originating from each source in a plurality of almost collimated light beams toward the module to be tested, in a direction perpendicular to the surface of the module, a synchronization system of the light sources, configured to trigger the supply device of each lamp at a respective instant determined as a function of the turn-on delay of the lamp such that the pulses of the lamps are simultaneously emitted and simultaneously received by the sub-modules, and a measuring device for measuring the response of the module during the simultaneous pulses.

* * * * *